US010892280B2

(12) United States Patent
Xu et al.

(10) Patent No.: US 10,892,280 B2
(45) Date of Patent: Jan. 12, 2021

(54) INTER-DECK PLUG IN THREE-DIMENSIONAL MEMORY DEVICE AND METHOD FOR FORMING THE SAME

(71) Applicant: YANGTZE MEMORY TECHNOLOGIES CO., LTD., Wuhan (CN)

(72) Inventors: Qianbin Xu, Wuhan (CN); Haohao Yang, Wuhan (CN); EnBo Wang, Wuhan (CN); Yong Zhang, Wuhan (CN); Jialan He, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 0 days.

(21) Appl. No.: 16/915,939

(22) Filed: Jun. 29, 2020

(65) Prior Publication Data
US 2020/0335515 A1 Oct. 22, 2020

Related U.S. Application Data

(60) Division of application No. 16/194,267, filed on Nov. 16, 2018, now Pat. No. 10,741,578, which is a
(Continued)

(51) Int. Cl.
*H01L 27/11582* (2017.01)
*H01L 27/1157* (2017.01)

(52) U.S. Cl.
CPC .... *H01L 27/11582* (2013.01); *H01L 27/1157* (2013.01)

(58) Field of Classification Search
CPC ........... H01L 27/11582; H01L 27/1157; H01L 27/11578
See application file for complete search history.

(56) References Cited

U.S. PATENT DOCUMENTS

| 2011/0065270 A1* | 3/2011 | Shim ................ H01L 27/11582 438/589 |
| 2012/0104484 A1 | 5/2012 | Lee et al. |

(Continued)

FOREIGN PATENT DOCUMENTS

| CN | 102110690 A | 6/2011 |
| CN | 105244351 A | 1/2016 |

(Continued)

OTHER PUBLICATIONS

International Search Report issued in corresponding International Application No. PCT/CN2018/109396 dated Jul. 24, 2019, 5 pages.
(Continued)

*Primary Examiner* — Mohammed R Alam
(74) *Attorney, Agent, or Firm* — Bayes PLLC

(57) ABSTRACT

Embodiments of 3D memory devices having an inter-deck plug and methods for forming the same are disclosed. In an example, a 3D memory device includes a substrate, a first memory deck including interleaved conductor and dielectric layers above the substrate, a second memory deck including interleaved conductor and dielectric layers above the first memory deck, and a first and a second channel structure each extending vertically through the first or second memory deck. The first channel structure includes a first memory film and semiconductor channel along a sidewall of the first channel structure, and an inter-deck plug in an upper portion of the first channel structure and in contact with the first semiconductor channel. A lateral surface of the inter-deck plug is smooth. The second channel structure includes a second memory film and semiconductor channel along a sidewall of the second channel structure. The second semiconductor channel is in contact with the inter-deck plug.

20 Claims, 13 Drawing Sheets

Related U.S. Application Data continuation of application No. PCT/CN2018/109396, filed on Oct. 9, 2018.

(56) References Cited

U.S. PATENT DOCUMENTS

| | | | |
|---|---|---|---|
| 2013/0313629 A1 | 11/2013 | Shim et al. | |
| 2015/0069484 A1 | 3/2015 | Lee | |
| 2016/0005760 A1* | 1/2016 | Lee | H01L 27/1157 257/324 |
| 2019/0304992 A1* | 10/2019 | Baek | H01L 27/11582 |

FOREIGN PATENT DOCUMENTS

| | | |
|---|---|---|
| CN | 108493192 A | 9/2018 |
| CN | 108565266 A | 9/2018 |
| CN | 108615733 A | 10/2018 |

OTHER PUBLICATIONS

Written Opinion of the International Searching Authority issued in corresponding International Application No. PCT/CN2018/109396 dated Jul. 24, 2019, 4 pages.

\* cited by examiner

101

INTER-DECK PLUG IN THREE-DIMENSIONAL MEMORY DEVICE AND METHOD FOR FORMING THE SAME

CROSS REFERENCE TO RELATED APPLICATION

This application is divisional of U.S. application Ser. No. 16/194,267, filed on Nov. 16, 2018, entitled "INTER-DECK PLUG IN THREE-DIMENSIONAL MEMORY DEVICE AND METHOD FOR FORMING THE SAME," which is continuation of International Application No. PCT/CN2018/109396, filed on Oct. 9, 2018, entitled "INTER-DECK PLUG IN THREE-DIMENSIONAL MEMORY DEVICE AND METHOD FOR FORMING THE SAME," both of which are hereby incorporated by reference in their entireties.

BACKGROUND

Embodiments of the present disclosure relate to three-dimensional (3D) memory devices and fabrication methods thereof.

Planar memory cells are scaled to smaller sizes by improving process technology, circuit design, programming algorithm, and fabrication process. However, as feature sizes of the memory cells approach a lower limit, planar process and fabrication techniques become challenging and costly. As a result, memory density for planar memory cells approaches an upper limit.

A 3D memory architecture can address the density limitation in planar memory cells. The 3D memory architecture includes a memory array and peripheral devices for controlling signals to and from the memory array.

SUMMARY

Embodiments of 3D memory devices having an inter-deck plug and methods for forming the same are disclosed herein.

In one example, a 3D memory device includes a substrate, a first memory deck including a first plurality of interleaved conductor layers and dielectric layers above the substrate, a first channel structure extending vertically through the first memory deck, a second memory deck including a second plurality of interleaved conductor layers and dielectric layers above the first memory deck, and a second channel structure extending vertically through the second memory deck. The first channel structure includes a first memory film and a first semiconductor channel along a sidewall of the first channel structure, and an inter-deck plug in an upper portion of the first channel structure and in contact with the first semiconductor channel. A lateral surface of the inter-deck plug is smooth. The second channel structure includes a second memory film and a second semiconductor channel along a sidewall of the second channel structure. The second semiconductor channel is in contact with the inter-deck plug.

In another example, a method for forming a 3D memory device is disclosed. A first dielectric deck including a first plurality of interleaved sacrificial layers and dielectric layers is formed above a substrate. A first channel structure extending vertically through the first dielectric deck and including a first memory film and a first semiconductor channel is formed. An inter-deck plug is formed in an upper portion of the first channel structure and in contact with the first semiconductor channel, and a recess is formed between a top surface of the inter-deck plug and a top surface of the first dielectric deck. An etch stop plug is formed in the recess to cover the top surface of the inter-deck plug. A second dielectric deck including a second plurality of interleaved sacrificial layers and dielectric layers is formed above the first dielectric deck. A first opening extending vertically through the second dielectric deck and ending at the etch stop plug is formed. The etch stop plug is removed from the recess to form a channel hole including the first opening and the recess. A second memory film is formed along a sidewall of the first opening and in the recess of the channel hole. A second semiconductor channel is formed over the second memory film and extending vertically through part of the second memory film in the recess to contact the inter-deck plug.

In still another example, a method for forming an inter-deck plug in a 3D memory device is disclosed. A lower channel structure extending vertically through a first plurality of interleaved sacrificial layers and dielectric layers above a substrate is formed. A stepped recess is etched in an upper portion of the lower channel structure. A semiconductor layer is deposited to fill the stepped recess. An etch stop recess is etched in an upper portion of the semiconductor layer to form an inter-deck plug having a smooth lateral surface. An etch stop layer is deposited to fill the etch stop recess. A second plurality of interleaved sacrificial layers and dielectric layers are alternatingly deposited above the etch stop layer and the first plurality of interleaved sacrificial layers and dielectric layers. A first opening is etched through the second plurality of interleaved sacrificial layers and dielectric layers until being stopped by the etch stop layer. The etch stop layer is etched away from the etch stop recess to expose the inter-deck plug.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

Figure 1A:
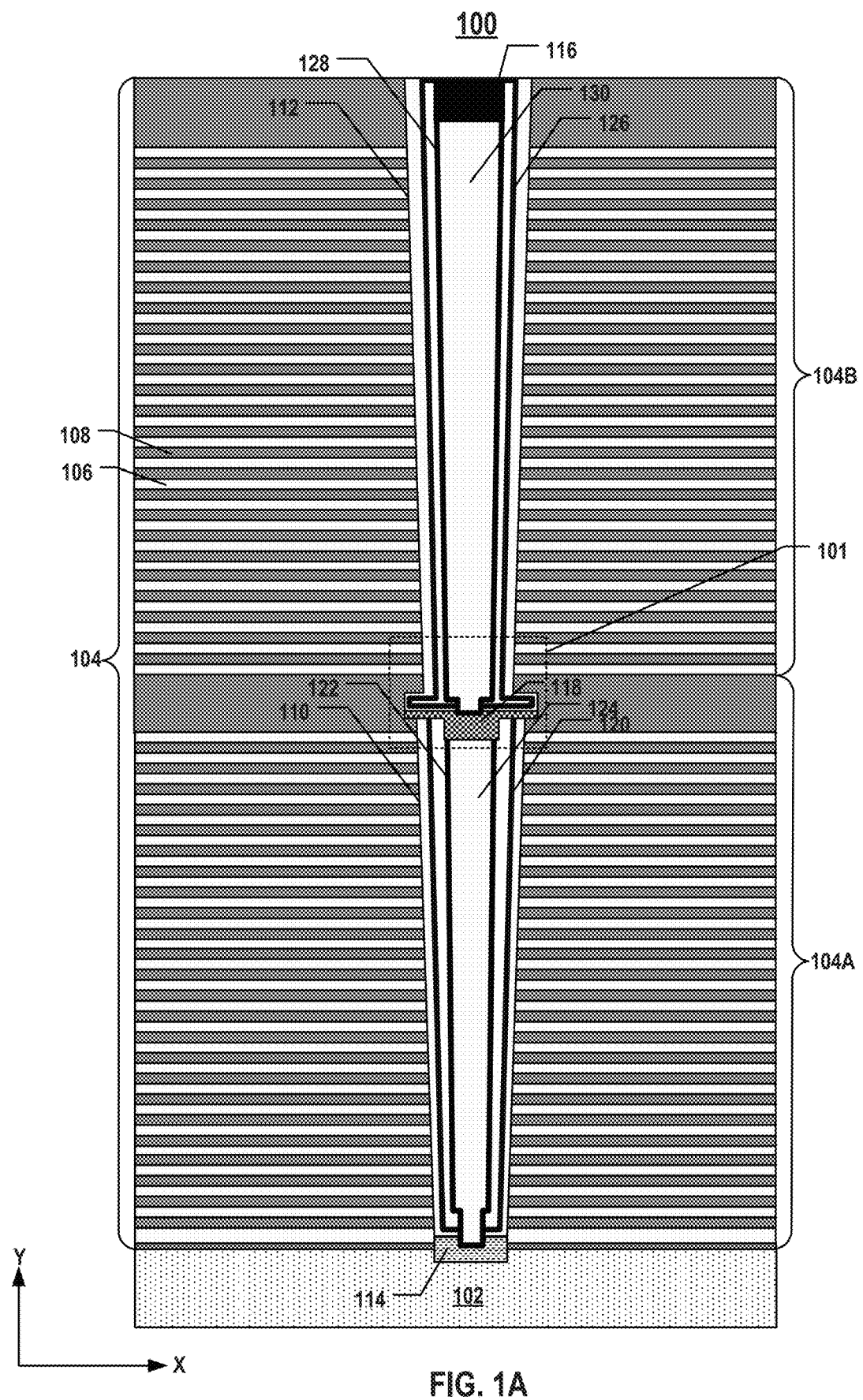
FIG. 1A illustrates a cross-section of an exemplary 3D memory device having an inter-deck plug with protrusions.

Embodiments of the present disclosure will be described with reference to the accompanying drawings.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to effect such feature, structure or characteristic in connection with other embodiments whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductor and contact layers (in which interconnect lines and/or via contacts are formed) and one or more dielectric layers.

As used herein, the term "nominal/nominally" refers to a desired, or target, value of a characteristic or parameter for a component or a process operation, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

As used herein, the term "3D memory device" refers to a semiconductor device with vertically oriented strings of memory cell transistors (referred to herein as "memory strings," such as NAND memory strings) on a laterally-oriented substrate so that the memory strings extend in the vertical direction with respect to the substrate. As used herein, the term "vertical/vertically" means nominally perpendicular to the lateral surface of a substrate.

In fabricating 3D NAND memory devices with advanced technologies, such as having 96 or more levels, a dual-deck architecture is usually used, which includes two stacked channel structures that can be electrically connected by an inter-deck plug structure. The known structure of inter-deck plugs, however, encounters a significant issue of drop current due to its non-smooth lateral surface (e.g., having protrusions thereon).

For example, FIG. 1A illustrates a cross-section of an exemplary 3D memory device 100 having a NAND memory string extending vertically through a dual-deck memory stack 104 (including a lower memory deck 104A and an upper memory deck 104B). Each of lower and upper memory decks 104A and 104B includes a plurality of pairs each including a conductor layer 106 and a dielectric layer 108 (referred to herein as "conductor/dielectric layer pairs") formed above a substrate 102. Substrate 102 can include silicon (e.g., single crystalline silicon), silicon germanium (SiGe), gallium arsenide (GaAs), germanium (Ge), silicon on insulator (SOI), germanium on insulator (GOI), or any other suitable materials.

It is noted that x and y axes are included in FIG. 1A to further illustrate the spatial relationship of the components in 3D memory device 100. Substrate 102 of 3D memory device 100 includes two lateral surfaces (e.g., a top surface and a bottom surface) extending laterally in the x-direction (i.e., the lateral direction). As used herein, whether one component (e.g., a layer or a device) is "on," "above," or "below" another component (e.g., a layer or a device) of a 3D memory device (e.g., 3D memory device 100) is determined relative to the substrate of the 3D memory device (e.g., substrate 102) in the y-direction (i.e., the vertical direction) when the substrate is positioned in the lowest plane of the 3D memory device in the y-direction. The same notion for describing spatial relationship is applied throughout the present disclosure.

The NAND memory string of 3D memory device 100 includes a lower channel structure 110 and an upper channel structure 112 each extending vertically through lower memory deck 104A and upper memory deck 104B, respectively. As shown in FIG. 1, 3D memory device 100 also include a semiconductor plug 114 at the lower end of lower channel structure 110 and a channel plug 116 at the upper end of upper channel structure 112.

As the connection between lower channel structure 110 and upper channel structure 112, lower channel structure 110 includes an inter-deck plug 118 in its upper portion. Lower channel structure 110 further includes a lower memory film 120 and a lower semiconductor channel 122 along its sidewall and surrounding a lower filling layer 124. Similarly, upper channel structure 112 includes an upper memory film 126 and an upper semiconductor channel 128 along its sidewall and surrounding an upper filling layer 130. Lower semiconductor channel 122 and upper semiconductor channel 128 each in contact with inter-deck plug 118 on its opposite sides and thus, are electrically connected by inter-deck plug 118. Lower semiconductor channel 122 and upper semiconductor channel 128 are electrically connected to semiconductor plug 114 and channel plug 116, respectively.

Figure 1B:
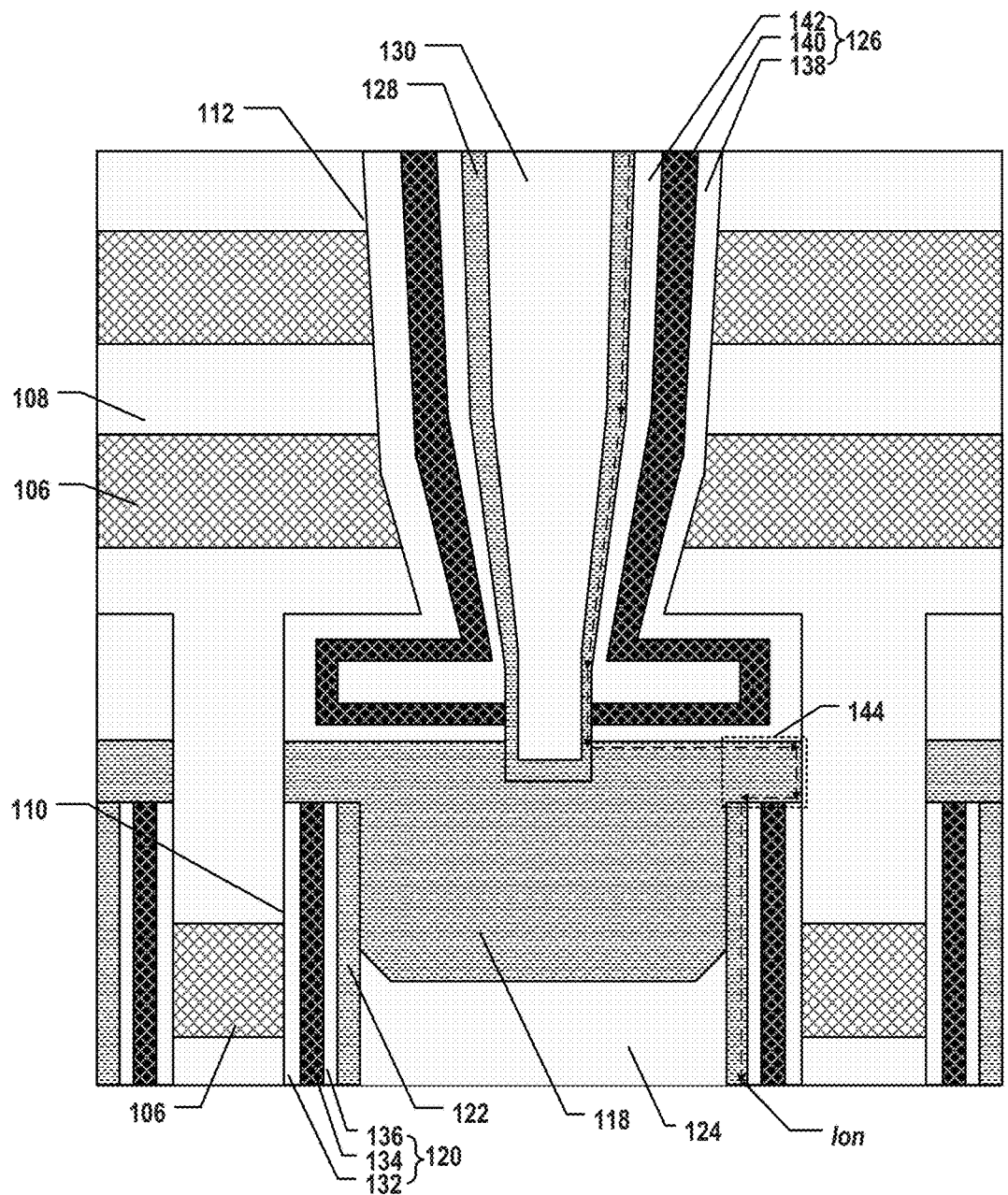
FIG. 1B illustrates an enlarged cross-section of an area including the inter-deck plug in FIG. 1A.

FIG. 1B illustrates an enlarged cross-section of an area 101 including inter-deck plug 118 in FIG. 1A. As shown in FIG. 1B, lower memory film 120 further includes a lower blocking layer 132, a lower storage layer 134, and a lower tunneling layer 136 disposed radially in this order toward the center of lower channel structure 110. Similarly, upper memory film 126 further includes an upper blocking layer 138, an upper storage layer 140, and an upper tunneling layer 142 disposed radially in this order toward the center of upper channel structure 112. Inter-deck plug 118, as shown in FIG. 1B, has a non-smooth lateral surface with protrusions 144. The top surface of inter-deck plug 118 is above the upper ends of lower memory film 120 and lower semiconductor channel 122. The upper ends of lower memory film 120 and lower semiconductor channel 122 are in contact with protrusions 144 of inter-deck plug 118.

Because electrical current tends to flow along the outer surface of a conductive structure, the stepped shape of inter-deck plug 118 with protrusions 144 can detour the path of current Ion from upper semiconductor channel 128 through inter-deck plug 118 to lower semiconductor channel 122 as shown in FIG. 1B. As a result, current Ion will drop as it goes through the tortuous path along the edges of protrusions 144, which can become even worse as the thickness of protrusions 144 increases.

Various embodiments in accordance with the present disclosure provide an improved structure and fabrication method of inter-deck plugs in 3D memory devices that can address the current drop issue. In some embodiments, the lateral surface of the inter-deck plug is smooth, i.e., without protrusions. In some embodiments, the upper memory film fully fills the recess above the inter-deck plug such that the upper semiconductor channel is not diverged laterally into the recess when it is deposited. Thus, current Ion can take a straight path along the upper semiconductor channel and the smooth lateral surface of the inter-deck plug to minimize current drop caused by the tortuous current path. That is, the inter-deck plug structure disclosed herein has no weak point to drop current and also provides sufficient process margins.

Figure 2:
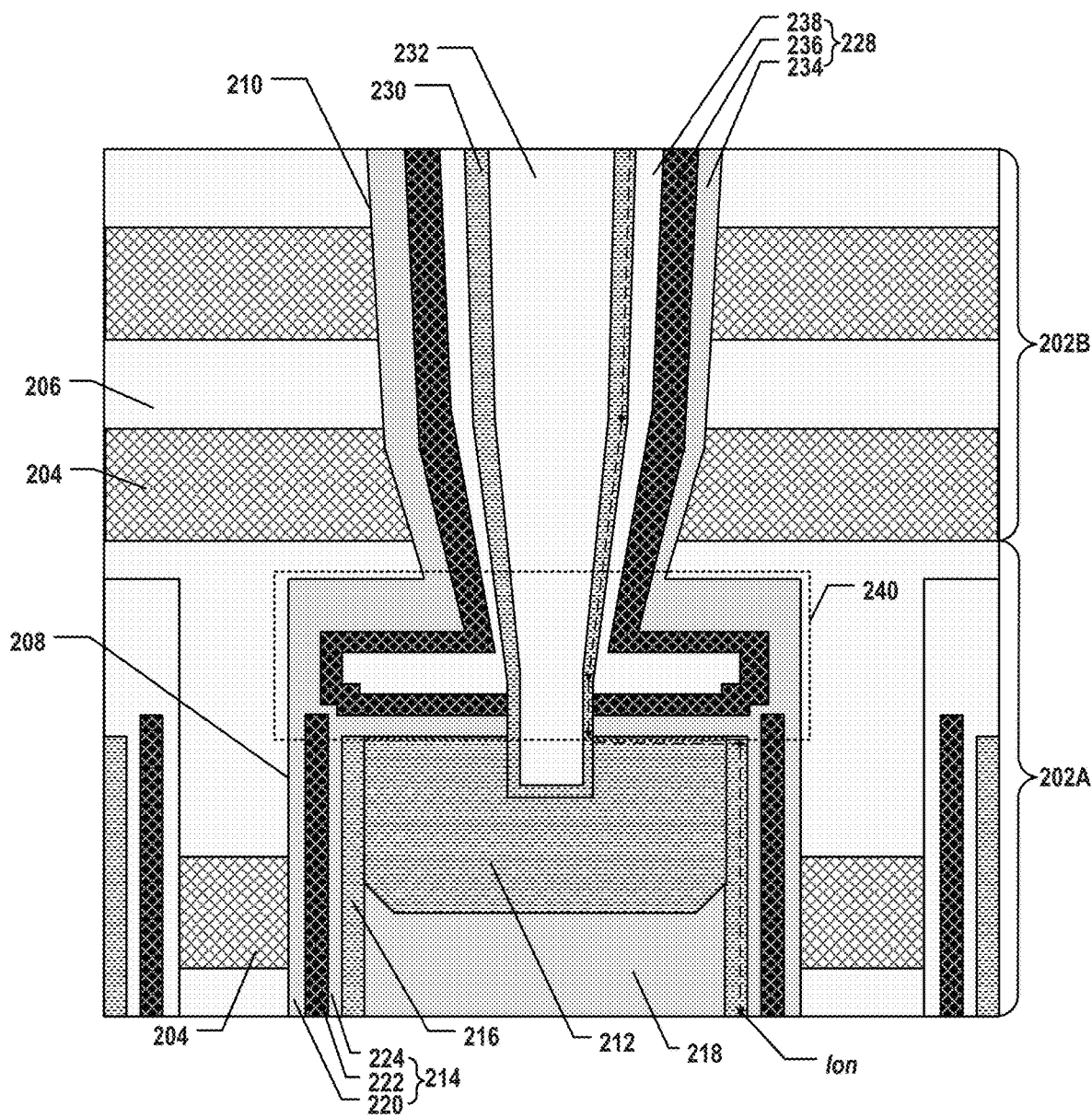
FIG. 2 illustrates a cross-section of an exemplary 3D memory device having an inter-deck plug with a smooth lateral surface, according to some embodiments of the present disclosure.

FIG. 2 illustrates a cross-section of an exemplary 3D memory device 200 having an inter-deck plug 212 with a smooth lateral surface, according to some embodiments of the present disclosure. It is understood that FIG. 2 illustrates only the enlarged area including inter-deck plug 212, similar to area 101 in FIGS. 1A-1B, as the remaining structures can be the same as the counterparts in FIG. 1A, which are not repeated in FIG. 2.

3D memory device 200 can be part of a monolithic 3D memory device. The term "monolithic" means that the components (e.g., the peripheral device and memory array device) of the 3D memory device are formed on a single substrate. For monolithic 3D memory devices, the fabrication encounters additional restrictions due to the convolution of the peripheral device processing and the memory array device processing. For example, the fabrication of the memory array device (e.g., NAND memory strings) is constrained by the thermal budget associated with the peripheral devices that have been formed or to be formed on the same substrate.

Alternatively, 3D memory device 200 can be part of a non-monolithic 3D memory device, in which components (e.g., the peripheral device and memory array device) can be formed separately on different substrates and then bonded, for example, in a face-to-face manner. In some embodiments, the memory array device substrate remains as the substrate of the bonded non-monolithic 3D memory device, and the peripheral device (e.g., including any suitable digital, analog, and/or mixed-signal peripheral circuits used for facilitating the operation of 3D memory device 200, such as page buffers, decoders, and latches; not shown) is flipped and faces down toward the memory array device (e.g., NAND memory strings) for hybrid bonding. It is understood that in some embodiments, the memory array device substrate is flipped and faces down toward the peripheral device (not shown) for hybrid bonding, so that in the bonded non-monolithic 3D memory device, the memory array device is above the peripheral device. The memory array device substrate can be a thinned substrate (which is not the substrate of the bonded non-monolithic 3D memory device), and the back-end-of-line (BEOL) interconnects of the non-monolithic 3D memory device can be formed on the backside of the thinned memory array device substrate.

In some embodiments, 3D memory device 200 is a NAND Flash memory device in which memory cells are provided in the form of an array of NAND memory strings each extending vertically through a lower memory deck 202A above a substrate (not shown) and an upper memory deck 202B above lower memory deck 202A. That is, 3D memory device 200 has a dual-deck architecture, according to some embodiments. Each of lower memory deck 202A and upper memory deck 202B can include a plurality of pairs each including a conductor layer 204 and a dielectric layer 206 (referred to herein as "conductor/dielectric layer pairs"). The number of the conductor/dielectric layer pairs (e.g., 32, 64, 96, or 128) determines the number of memory cells in 3D memory device 200. The numbers of conductor/dielectric layer pairs in each of lower and upper memory decks 202A and 202B can be the same or different. Each of lower memory deck 202A and upper memory deck 202B includes a plurality of interleaved conductor layers 204 and dielectric layers 206, according to some embodiments. Conductor layers 204 can include conductive materials including, but not limited to, tungsten (W), cobalt (Co), copper (Cu), aluminum (Al), polysilicon, doped silicon, silicides, or any combination thereof. Dielectric layers 206 can include dielectric materials including, but not limited to, silicon oxide, silicon nitride, silicon oxynitride, or any combination thereof.

As shown in FIG. 2, the NAND memory string include a lower channel structure 208 extending vertically through lower memory deck 202A, and an upper channel structure 210 extending vertically through upper memory deck 202B. Each of lower and upper channel structures 208 and 210 can include a channel hole filled with semiconductor material(s) (e.g., as a lower semiconductor channel 216 and an upper semiconductor channel 230) and dielectric material(s) (e.g., as a lower memory film 214 and an upper memory film 228). In some embodiments, lower and upper semiconductor channels 216 and 230 each includes silicon, such as amorphous silicon, polysilicon, or single crystalline silicon. In some embodiments, lower memory film 214 is a composite layer including a lower blocking layer 220, a lower storage layer 222 (also known as a "charge trap layer"), and a lower tunneling layer 224; and upper memory film 228 is a composite layer including an upper blocking layer 234, an upper storage layer 236 (also known as a "charge trap layer"), and an upper tunneling layer 238. The remaining spaces of lower channel structure 208 and upper channel structure 210 can be partially or fully filled with a lower filling layer 218 and an upper filling layer 232, respectively, each including dielectric materials, such as silicon oxide.

Each of lower and upper channel structures 208 and 210 can have a cylinder shape (e.g., a pillar shape). Lower filling layer 218, lower semiconductor channel 216, lower tunneling layer 224, lower storage layer 222, and lower blocking layer 220 are arranged radially from the center toward the outer surface of the pillar in this order, according to some embodiments. Similarly, upper filling layer 232, upper semiconductor channel 230, upper tunneling layer 238, upper storage layer 236, and upper blocking layer 234 are arranged radially from the center toward the outer surface of the pillar in this order, according to some embodiments. Lower and upper tunneling layers 224 and 238 can include silicon oxide, silicon oxynitride, or any combination thereof. Lower and upper storage layers 222 and 236 can include silicon nitride, silicon oxynitride, silicon, or any combination thereof. Lower and upper blocking layers 220 and 234 can include silicon oxide, silicon oxynitride, high dielectric constant (high-k) dielectrics, or any combination thereof. In one example, each of lower and upper memory films 214 and 228 can include a composite layer of silicon oxide/silicon nitride (or silicon oxynitride)/silicon oxide (ONO).

As shown in FIG. 2, lower memory film 214 and lower semiconductor channel 216 each extends vertically along the sidewall of lower channel structure 208, according to some embodiments. As to upper channel structure 210, it can include a lower portion 240 in which part of upper memory film 228 extends laterally. The remaining part of upper memory film 228 extends vertically along the sidewall of upper channel structure 210, according to some embodiments. Upper semiconductor channel 230 can extend vertically along the sidewall of upper channel structure 210 and through part of upper memory film 228 in lower portion 240 of upper channel structure 210. The diameter of lower portion 240 of upper channel structure 210 can be nominally the same as the diameter of lower channel structure 208 and greater than the diameter of the remaining part of upper channel structure 210.

In some embodiments, the thickness of lower portion 240 of upper channel structure 210 is not greater than two times of the thickness of upper memory film 228 (i.e., the combined thickness of upper blocking layer 234, upper storage layer 236, and upper tunneling layer 238). As each of upper blocking layer 234, upper storage layer 236, and upper tunneling layer 238 can be a conformal layer deposited along the sidewall and the top and bottom surfaces of lower portion 240 of upper memory film 228, by controlling the combined thickness thereof (i.e., the thickness of upper memory film 228) to be equal to or greater than one-half of the thickness of lower portion 240 of upper channel structure 210, no remaining space will be left for later formed upper semiconductor channel 230 in lower portion 240. In other words, upper memory film 228 can fully fill in lower portion 240 of upper channel structure 210, leaving no space for upper semiconductor channel 230. As a result, upper semiconductor channel 230 extends vertically through (but cannot extend laterally in) lower portion 240 of upper channel structure 210, which can avoid a tortuous current path in lower portion 240. In some embodiments, the thickness of lower portion 240 of upper channel structure 210 is between about 20 nm and about 40 nm, such as between 20 nm and 40 nm (e.g., 20 nm, 22 nm, 24 nm, 26 nm, 28 nm, 30 nm, 32 nm, 34 nm, 36 nm, 38 nm, 40 nm, any range bounded by the lower end by any of these values, or in any range defined by any two of these values).

As shown in FIG. 2, lower channel structure 208 can include an inter-deck plug 212 in the upper portion of lower channel structure 208 and in contact with both lower semiconductor channel 216 and upper semiconductor channel 230. In some embodiments, lower semiconductor channel 216 is in contact with at least part of the lateral surface of inter-deck plug 212. Upper semiconductor channel 230 extends into part of inter-deck plug 212 from its top surface to contact inter-deck plug 212, according to some embodiments. Upper semiconductor channel 230 can extend vertically through part of upper memory film 228 in lower portion 240 of upper channel structure 210 to contact inter-deck plug 212. Lower semiconductor channel 216, upper semiconductor channel 230, and inter-deck plug 212 can each include polysilicon (e.g., doped with p-type or n-type dopants).

Different from FIG. 1B in which inter-deck plug 118 has a non-smooth lateral surface with protrusions 144 thereon (e.g., having a stepped shape), inter-deck plug 212 in 3D memory device 200 in FIG. 2 has a smooth lateral surface without protrusions thereon. In some embodiments, the top surface of inter-deck plug 212 is flush with the upper end of lower semiconductor channel 216 and below the upper end of lower memory film 214, which is also different from the structure of inter-deck plug 118 in FIG. 1B. The upper end of lower memory film 214 is not in contact with inter-deck plug 212, according to some embodiments. The structure of inter-deck plug 212 as described above can avoid a tortuous current path in inter-deck plug 212. Combined with the structure of lower portion 240 of upper channel structure 210, current Ion in 3D memory device 200 can go through a current path that is less tortuous compared with the current path in 3D memory device 100 as shown in FIG. 1B. As shown in FIG. 2, current Ion can propagate first vertically along upper semiconductor channel 230, then along the top surface and smooth lateral surface of inter-deck plug 212, and finally vertically along lower semiconductor channel 216. As a result, the current drop issue can be reduced, minimized, or even eliminated in 3D memory device 200.

Figure 3A:
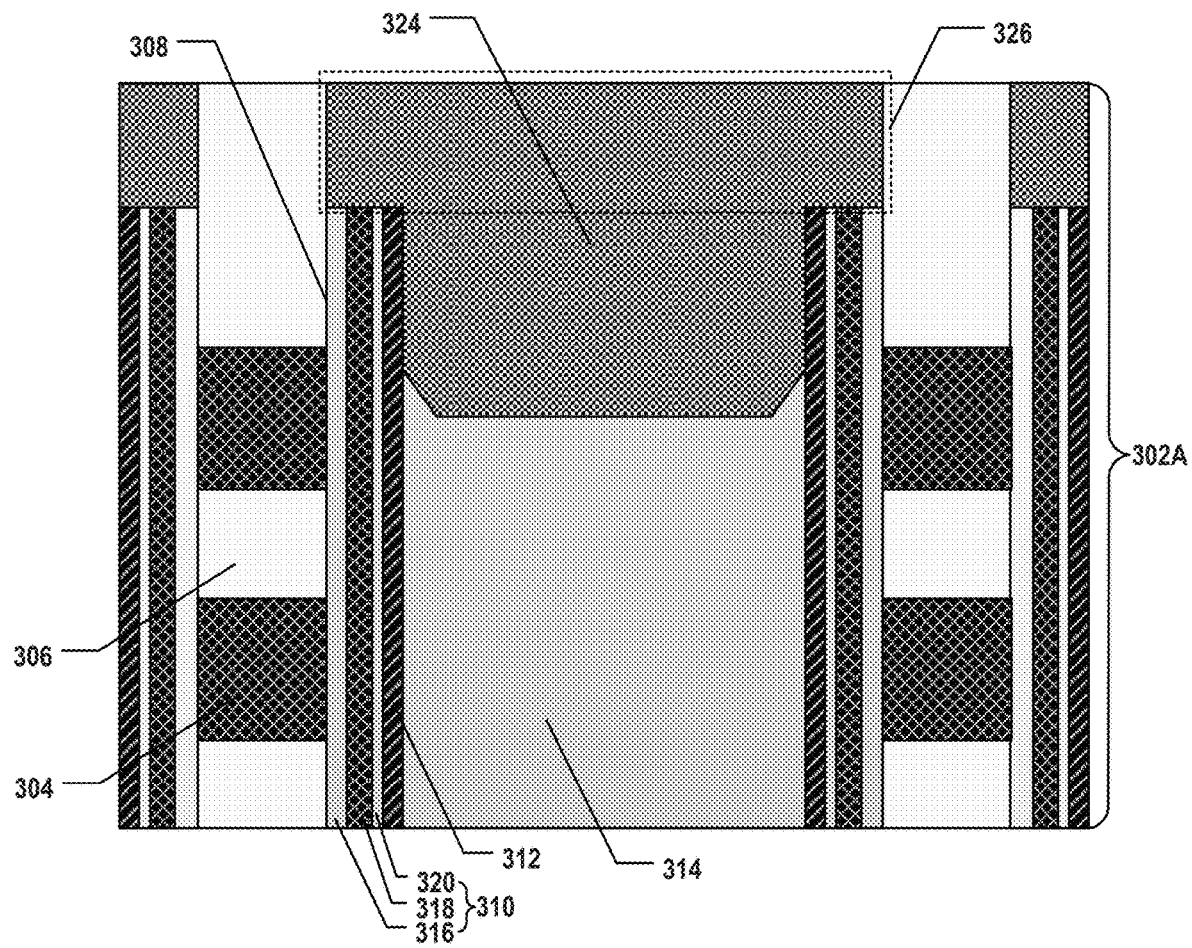
FIGS. 3A-3H illustrate an exemplary fabrication process for forming a 3D memory device having an inter-deck plug with a smooth lateral surface, according to some embodiments of the present disclosure.
Figure 4:
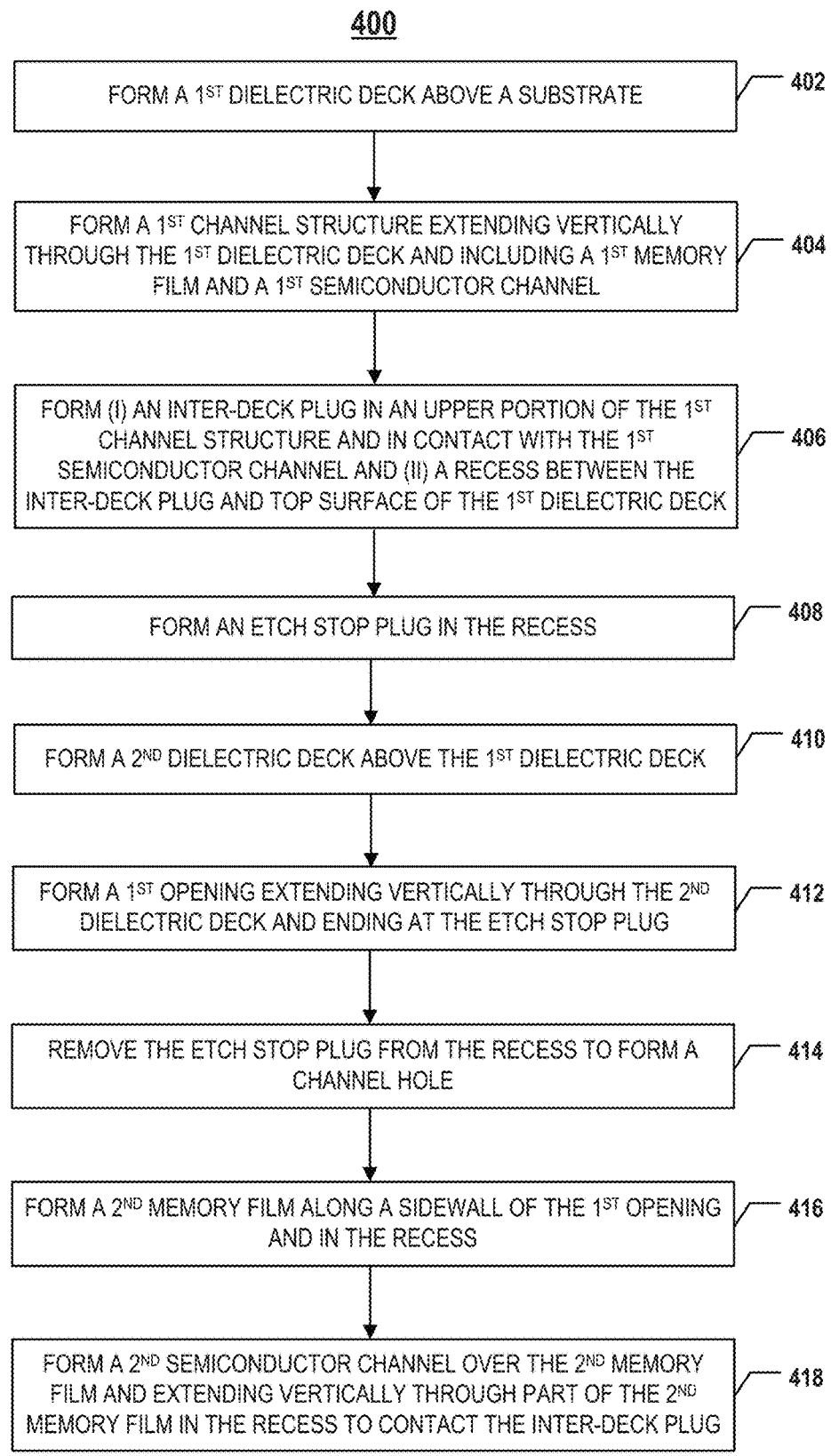
FIG. 4 illustrates a flowchart of an exemplary method for forming a 3D memory device having an inter-deck plug with a smooth lateral surface, according to some embodiments of the present disclosure.
Figure 5:
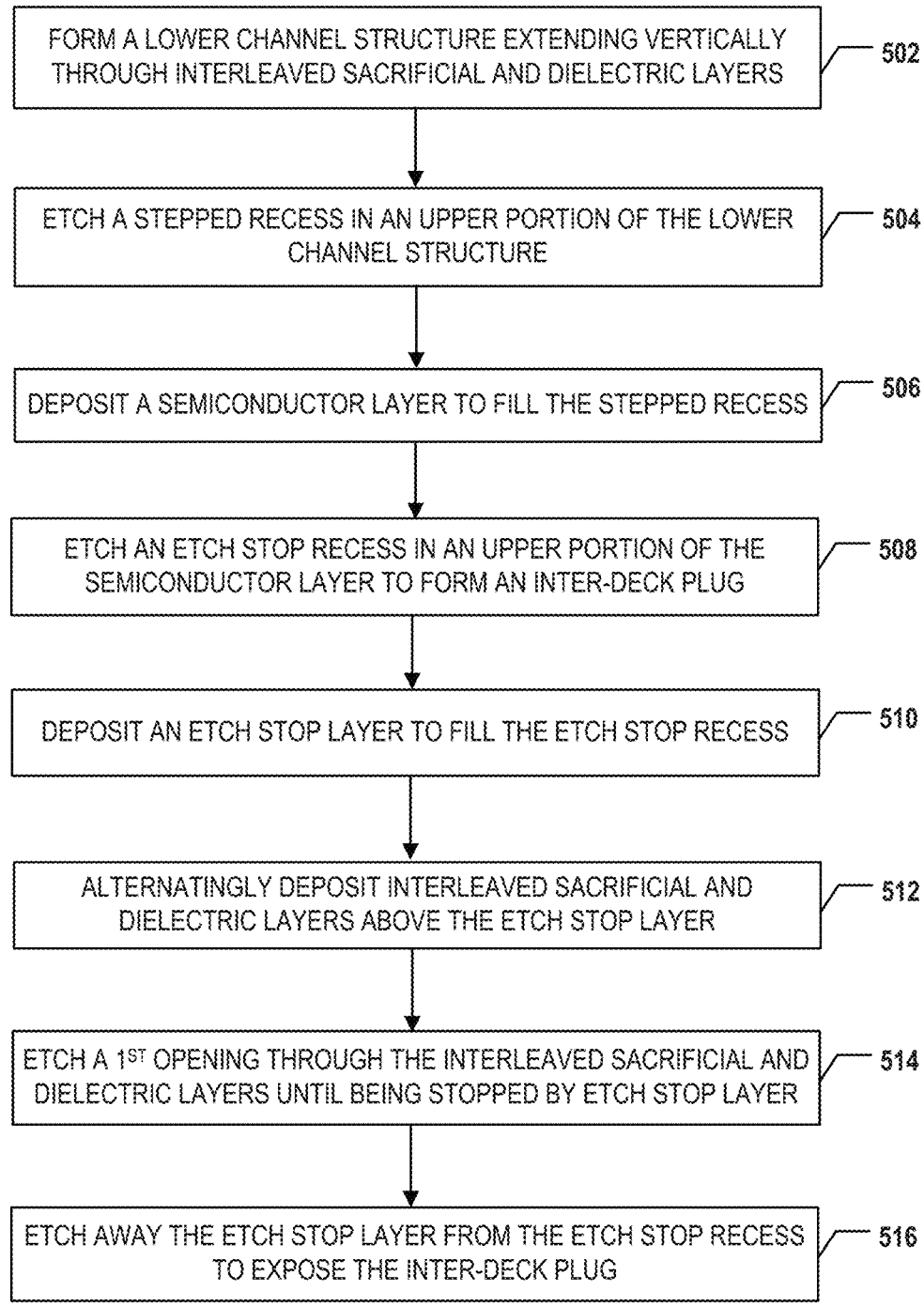
FIG. 5 illustrates a flowchart of an exemplary method for forming an inter-deck plug with a smooth lateral surface in a 3D memory device, according to some embodiments of the present disclosure.

FIGS. 3A-3H illustrate an exemplary fabrication process for forming a 3D memory device having an inter-deck plug with a smooth lateral surface, according to some embodiments of the present disclosure. FIG. 4 illustrates a flowchart of an exemplary method 400 for forming a 3D memory device having an inter-deck plug with a smooth lateral surface, according to some embodiments of the present disclosure. FIG. 5 illustrates a flowchart of an exemplary method 500 for forming an inter-deck plug with a smooth lateral surface in a 3D memory device, according to some embodiments of the present disclosure. Examples of the 3D memory device depicted in FIGS. 3A-3H and 4-5 include 3D memory device 200 depicted in FIG. 2. FIGS. 3A-3H and 4-5 will be described together. It is understood that the operations shown in methods 400 and 500 are not exhaustive and that other operations can be performed as well before, after, or between any of the illustrated operations. Further, some of the operations may be performed simultaneously, or in a different order than shown in FIGS. 4-5.

Referring to FIG. 4, method 400 starts at operation 402, in which a first dielectric deck is formed above a substrate. The substrate can be a silicon substrate. The first dielectric deck can include a first plurality of interleaved sacrificial layers and dielectric layers. Referring to FIG. 3A, a lower dielectric deck 302A including a plurality pairs of a first dielectric layer (known as a "sacrificial layer" 304) and a second dielectric layer 306 (together referred to herein as "dielectric layer pairs") is formed above a silicon substrate (not shown). In some embodiments, an insulation layer (not shown) is formed between lower dielectric deck 302A and the silicon substrate by depositing dielectric materials, such as silicon oxide, or by thermal oxidation, on the silicon substrate prior to the formation of lower dielectric deck 302A. Lower dielectric deck 302A includes interleaved sacrificial layers 304 and dielectric layers 306, according to some embodiments. Dielectric layers 306 and sacrificial layers 304 can be alternatingly deposited to form lower dielectric deck 302A. In some embodiments, each dielectric layer 306 includes a layer of silicon oxide, and each sacrificial layer 304 includes a layer of silicon nitride. Lower dielectric deck 302A can be formed by one or more thin film deposition processes including, but not limited to, chemical vapor deposition (CVD), physical vapor deposition (PVD), atomic layer deposition (ALD), or any combination thereof.

Method 400 proceeds to operation 404, as illustrated in FIG. 4, in which a first channel structure extending vertically through the first dielectric deck is formed. The first channel structure includes a first memory film and a first semiconductor channel. In the example shown in FIG. 5, at operation 502, a lower channel structure extending vertically through a first plurality of interleaved sacrificial layers and dielectric layers is formed above the substrate. In some embodiments, to form the lower channel structure, a lower memory film, a lower semiconductor channel, and a lower filling layer are subsequently deposited in this order.

As illustrated in FIG. 3A, a lower channel structure 308 is formed extending vertically through interleaved sacrificial layers 304 and dielectric layers 306 of lower dielectric deck 302A. In some embodiments, fabrication processes for forming lower channel structure 308 include wet etching and/or dry etching, such as deep ion reactive etching (DRIE), a lower channel hole through interleaved sacrificial layers 304 and dielectric layers 306 of lower dielectric deck 302A.

As illustrated in FIG. 3A, a lower memory film 310 (including a lower blocking layer 316, a lower storage layer 318, and a lower tunneling layer 320) and a lower semiconductor channel 312 are formed along the sidewall of the lower channel hole of lower channel structure 308. In some embodiments, lower memory film 310 is first deposited along the sidewall of lower channel structure 308, and lower semiconductor channel 312 is then deposited over lower memory film 310. Lower blocking layer 316, lower storage layer 318, and lower tunneling layer 320 can be subsequently deposited in this order using one or more thin film deposition processes, such as ALD, CVD, PVD, any other suitable processes, or any combination thereof, to form lower memory film 310. Lower semiconductor channel 312 can then be formed by depositing polysilicon or any other suitable semiconductor materials over lower tunneling layer 320 using one or more thin film deposition processes, such as ALD, CVD, PVD, any other suitable processes, or any combination thereof. In some embodiments, a silicon oxide layer, a silicon nitride layer (or a silicon oxynitride layer), a silicon oxide layer, and a polysilicon layer (an "SONO" structure) are subsequently deposited to form lower memory film 310 and lower semiconductor channel 312. In some embodiments, the remaining space of the lower channel hole after depositions of lower memory film 310 and lower semiconductor channel 312 is fully or partially filled to form a lower filling layer 314 by depositing dielectric materials, such as silicon oxide.

Method 400 proceeds to operation 406, as illustrated in FIG. 4, in which (i) an inter-deck plug in an upper portion of the first channel structure and in contact with the first semiconductor channel, and (ii) a recess between a top surface of the inter-deck plug and a top surface of the first dielectric deck, are formed. In some embodiments, to form the inter-deck plug and the recess, upper portions of the first memory film and the first semiconductor channel are removed; an initial inter-deck having a top surface flush with the top surface of the first dielectric deck and a bottom surface below an upper end of the first semiconductor channel is formed; and part of the initial inter-deck plug above the upper end of the first semiconductor channel is removed to form the inter-deck plug and the recess. The part of the initial inter-deck plug can be removed such that a top surface of the inter-deck plug is flush with an upper end of the first semiconductor channel. The lateral surface of the inter-deck plug is smooth, according to some embodiments. In the example shown in FIG. 5, at operation 504, a stepped recess is etched in an upper portion of the lower channel structure. At operation 506, a semiconductor layer is deposited to fill the stepped recess. At operation 508, an etch stop recess is etched in an upper portion of the semiconductor layer to form an inter-deck plug having a smooth lateral surface.

A stepped recess is etched in the upper portion of lower channel structure 308 where an initial inter-deck 324 having a stepped shape can be formed by depositing a semiconductor layer, as illustrated in FIG. 3A. In some embodiments, the upper portions of lower memory film 310 and lower semiconductor channel 312 are first removed, for example, by wet etching and/or dry etching. The lower portion of lower filling layer 314 can then be removed, for example, by wet etching and/or drying etching, to a depth that is lower than the depth to which lower memory film 310 and lower semiconductor channel 312 are etched. The stepped recess can thus be formed with its top surface flush with the top surface of lower dielectric deck 302A and its bottom surface below the upper end of lower semiconductor channel 312 (and the upper end of lower memory film 310) after etching. The different depths of lower filling layer 314 and lower semiconductor channel 312 (and lower memory film 310) after etching thus create a step of the stepped recess, according to some embodiments.

As illustrated in FIG. 3A, initial inter-deck plug 324 is formed by depositing a semiconductor layer to fill the stepped recess. A semiconductor layer, such as a polysilicon layer, can be deposited into the stepped recess by one or more thin film deposition processes including, but not limited to, CVD, PVD, ALD, electroplating, electroless plating, or any combination thereof. In some embodiments, the deposited semiconductor layer is doped with p-type or n-type dopants using ion implantation and/or thermal diffusion processes. The deposited semiconductor layer can be further planarized by chemical mechanical polishing (CMP), wet etching, and/or dry etching, such that the top surface of the deposited semiconductor layer (initial inter-deck plug 324) becomes flush with the top surface of lower dielectric deck 302A. Initial inter-deck plug 324 can thus be formed in the stepped recess with the same stepped shape as shown in FIG. 3A. An upper portion 326 of initial inter-deck plug 324 is above and in contact with the upper ends of lower memory film 310 and lower semiconductor channel 312 and has a diameter greater than the diameter of the remaining portion of initial inter-deck plug 324, according to some embodiments. Initial inter-deck plug 324 can have its top surface flush with the top surface of lower dielectric deck 302A and its bottom surface below the upper end of lower semiconductor channel 312. The lateral surface of initial inter-deck plug 324 is non-smooth with protrusions formed thereon in its upper portion 326, according to some embodiments. The stepped shape of initial inter-deck plug 324 (and its wider upper portion 326) can leave additional margins for later upper channel hole etch overlay.

Figure 3B:
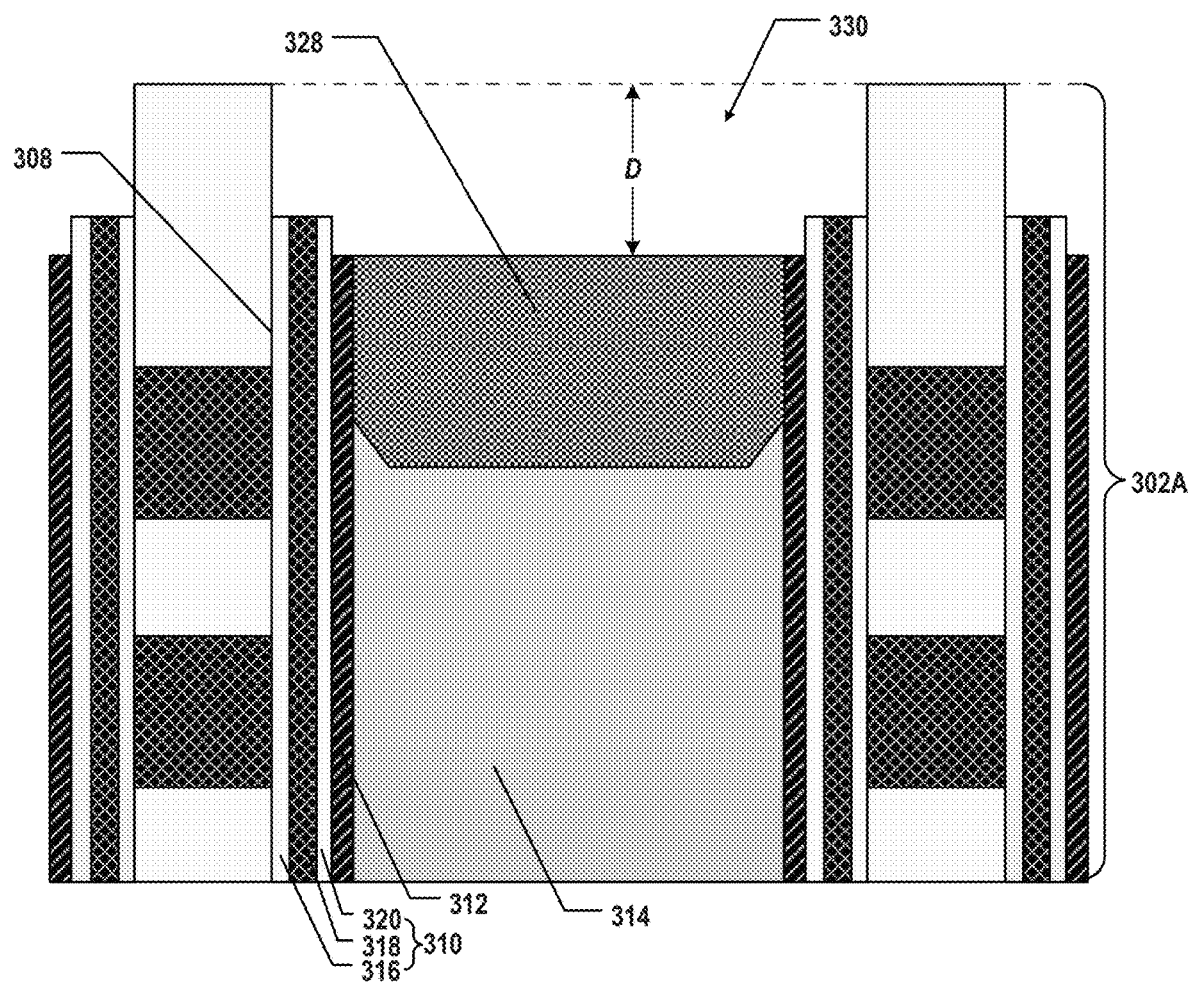

As illustrated in FIG. 3B, an inter-deck plug 328 and an etch stop recess 330 are formed by removing part of initial inter-deck plug 324 (shown in FIG. 3A) above the upper end of lower semiconductor channel 312 (including upper portion 326 of initial inter-deck plug 324 shown in FIG. 3A). Etch stop recess 330 can be formed by wet etching and/or drying etching upper portion 326 of initial inter-deck plug 324. In some embodiments, the etching process goes deeper than the upper end of lower memory film 310 after removing upper portion 326 of initial inter-deck plug 324, such that the top surface of inter-deck plug 328 is below the upper end of lower memory film 310. In some embodiments in which both lower semiconductor channel 312 and initial inter-deck plug 324 include the same materials, such as polysilicon, the further etching of initial inter-deck plug 324 also removes part of lower semiconductor channel 312, such that the upper end of lower semiconductor channel 312 becomes flush with the top surface of inter-deck plug 328 after etching. The space left by the part of initial inter-deck plug 324 after it has been removed becomes etch stop recess 330 between the top surface of lower dielectric deck 302A and the top surface of inter-deck plug 328. Etch stop recess 330 can have a stepped shape due to the different depths of the upper end of lower memory film 310 and top surface of inter-deck plug 328. The stepped shape of etch stop recess 330 can ensure that wider top portion 326 of initial inter-deck plug 324 is fully removed in inter-deck plug 328, such that the lateral surface of inter-deck plug 328 becomes smooth without protrusions after etching.

As illustrated in FIG. 3B, the depth D of etch stop recess 330 is measured between the top surface of lower dielectric deck 302A and the top surface of inter-deck plug 328. The depth D is not greater than two times of the thickness of an upper memory film 338 (shown in FIG. 3F) as described below in detail. In some embodiments, the depth D is between about 20 and about 40 nm, such as between 20 nm and 40 nm (e.g., 20 nm, 22 nm, 24 nm 26 nm, 28 nm, 30 nm, 32 nm, 34 nm, 36 nm, 38 nm, 40 nm, any range bounded by the lower end by any of these values, or in any range defined by any two of these values). As described below in detail, the depth D of etch stop recess 330 can ensure that etch stop recess 330 can be fully filled with upper memory film 338, leaving no space for an upper semiconductor channel 350 (shown in FIG. 3H) to be formed therein.

Method 400 proceeds to operation 408, as illustrated in FIG. 4, in which an etch stop plug is formed in the recess to cover the top surface of the inter-deck plug. In the example shown in FIG. 5, at operation 510, an etch stop layer is deposited to fill the etch stop recess. The etch stop layer can include a metal, such as tungsten.

Figure 3C:
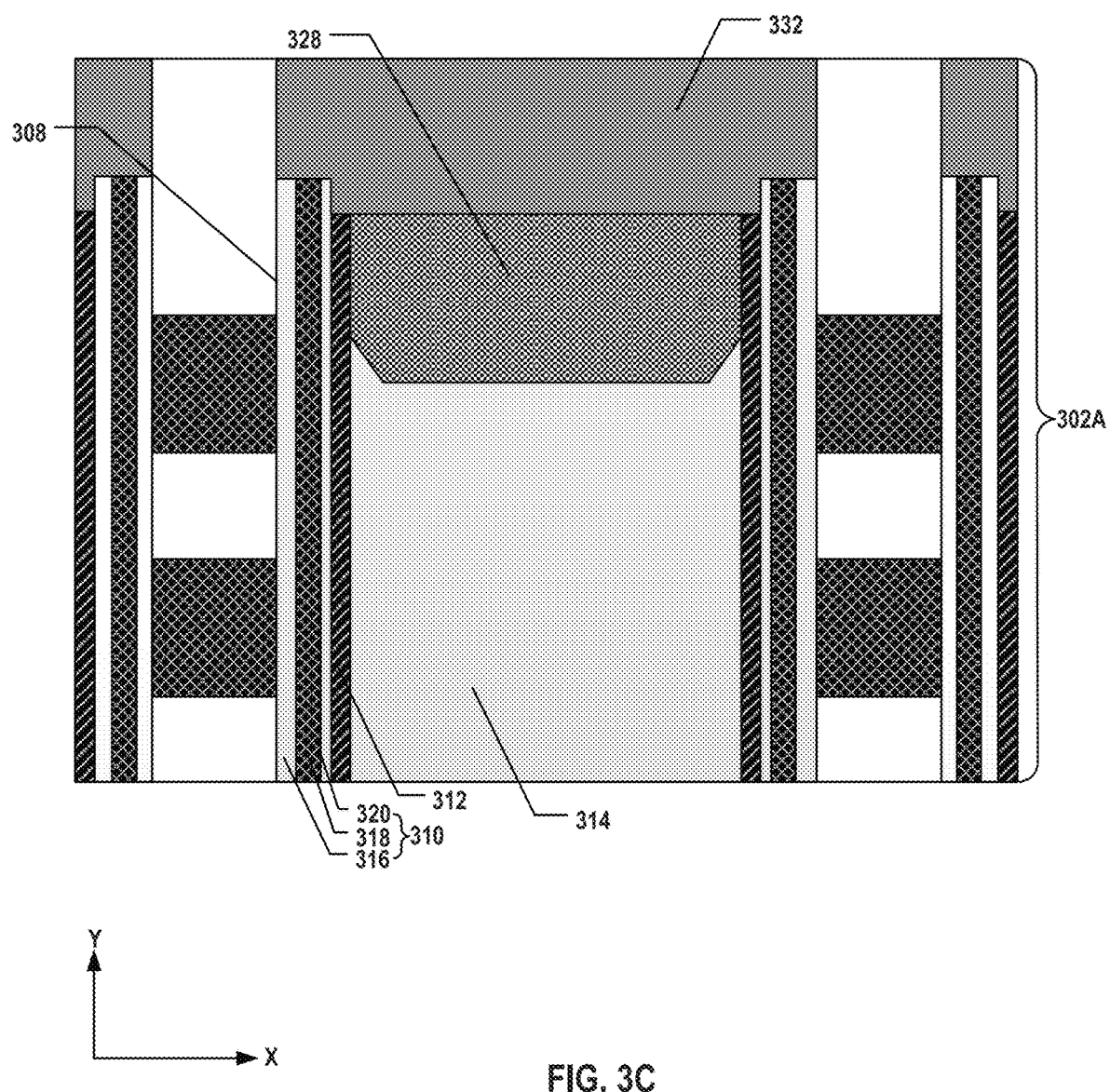

As illustrated in FIG. 3C, an etch stop plug 332 is formed in etch stop recess 330 (shown in FIG. 3B) to cover the top surface of inter-deck plug 328 as well as the upper ends of lower memory film 310 and lower semiconductor channel 312. Etch stop plug 332 can be formed by depositing an etch stop layer to fill etch stop recess 330 using one or more thin film deposition processes including, but not limited to, CVD, PVD, ALD, electroplating, electroless plating, or any combination thereof. The deposited etch stop layer can be planarized to remove the excess materials above the top surface of lower dielectric deck 302A by CMP, wet etching, and/or dry etching. The top surface of etch stop plug 332 is thus flush with the top surface of lower dielectric deck 302A, according to some embodiments. In some embodiments, etch stop plug 332 fully fills etch stop recess 330 without excess materials and thus, has the same dimensions as etch stop recess 330. The thickness of etch stop plug 332 is not greater than two times of the thickness of upper memory film 338 (shown in FIG. 3F), according to some embodiments. The thickness of etch stop plug 332 can be between about 20 nm and about 40 nm, such as between 20 nm and 40 nm (e.g., 20 nm, 22 nm, 24 nm 26 nm, 28 nm, 30 nm, 32 nm, 34 nm, 36 nm, 38 nm, 40 nm, any range bounded by the lower end by any of these values, or in any range defined by any two of these values). In some embodiments, etch stop plug 332 includes metals, such as W, Co, Cu, Al, or any other metals. It is understood that etch stop plug 332 can include any other suitable sacrificial materials that can be later removed. In some embodiments, etch stop plug 332 further includes titanium nitride (TiN) or tantalum nitride (TaN) as a barrier layer between the metal, such as tungsten, and inter-deck plug 328 (e.g., including polysilicon).

Method 400 proceeds to operation 410, as illustrated in FIG. 4, in which a second dielectric deck is formed above the first dielectric deck. Similar to the first dielectric deck, the second dielectric deck includes a second plurality of interleaved sacrificial layers and dielectric layers. In the example shown in FIG. 5, at operation 512, a second plurality of interleaved sacrificial layers and dielectric layers are alternatingly deposited above the etch stop layer and the first plurality of interleaved sacrificial layers and dielectric layers.

Figure 3D:
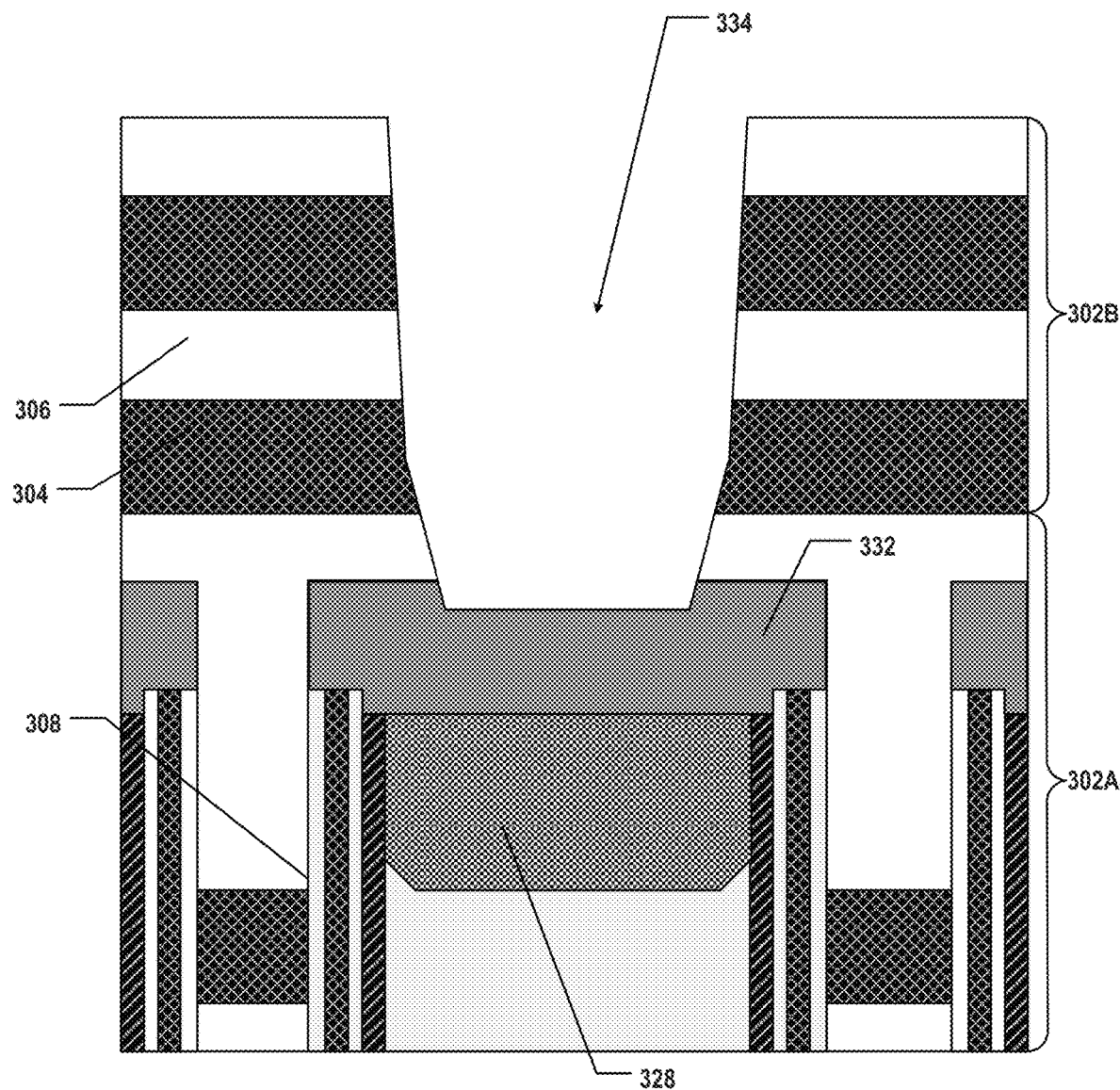

Referring to FIG. 3D, an upper dielectric deck 302B including interleaved sacrificial layers 304 and dielectric layers 306 is formed above lower dielectric deck 302A and etch stop plug 332 by alternatingly depositing sacrificial layers 304 (e.g., silicon nitride layers) and dielectric layers 306 (e.g., silicon oxide layers). Upper dielectric deck 302B can be formed by one or more thin film deposition processes including, but not limited to, CVD, PVD, ALD, or any combination thereof.

Method 400 proceeds to operation 412, as illustrated in FIG. 4, in which a first opening extending vertically through the second dielectric deck is formed, ending at the etch stop plug. In the example shown in FIG. 5, at operation 514, a first opening is etched through the second plurality of interleaved sacrificial layers and dielectric layers until being stopped by the etch stop layer.

As illustrated in FIG. 3D, an opening 334 is formed extending vertically through upper dielectric deck 302B and ending at etch stop plug 332. Opening 334 can be aligned with lower channel structure 308 and land on etch stop plug 332. In some embodiments, fabrication processes for forming opening 334 include wet etching and/or dry etching, such as DRIE. The etching of opening 334 can be stopped by etch stop plug 332 due to the different materials of etch stop plug 332 and dielectric layer 306 thereabove. In some embodiments, the etching process through upper dielectric deck 302B may not stop at the top surface of etch stop plug 332 and continue to etch part of etch stop plug 332 (also known as "gouging"). The gouging can be controlled to avoid etching through etch stop plug 332 to reach inter-deck plug 328. Nevertheless, etch stop plug 332 can protect inter-deck plug 328 underneath from the etching of opening 334. In some embodiments, the diameter of opening 334 is smaller than the diameter of etch stop plug 332.

Method 400 proceeds to operation 414 as illustrated in FIG. 4, in which the etch stop plug is removed from the recess to form a channel hole including the first opening and the recess. A diameter of the recess can be greater than a diameter of the first opening. In the example shown in FIG. 5, at operation 516, the etch stop layer is etched away from the etch stop recess to expose the inter-deck plug.

Figure 3E:
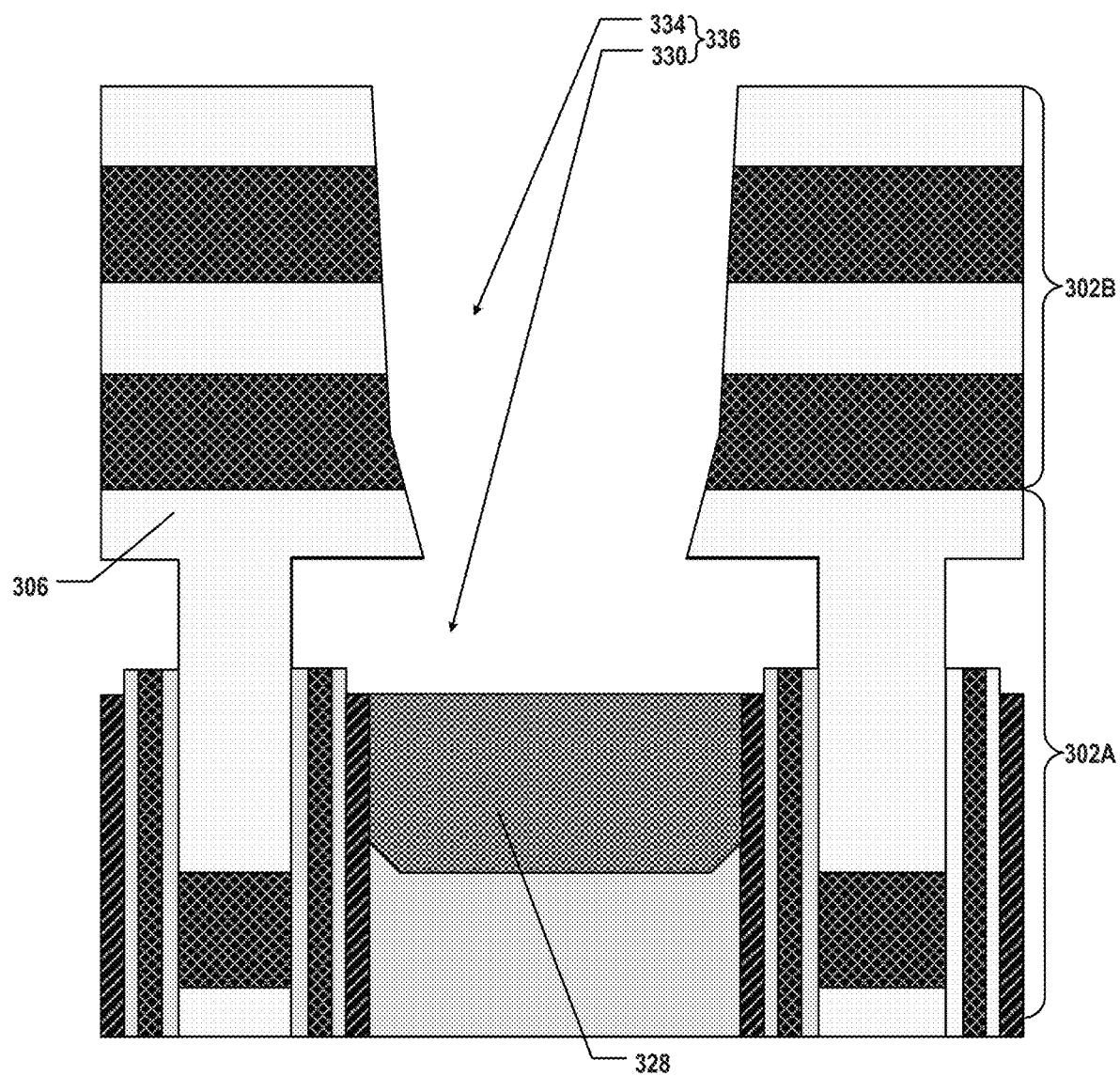

As illustrated in FIG. 3E, etch stop plug 332 (shown in FIG. 3D) is removed from etch stop recess 330, such that etch stop recess 330 is connected to opening 334 to form an upper channel hole 336. In some embodiments, the etch stop layer forming etch stop plug 332 is etched away from etch stop recess 330 through opening 334 using wet etching and/or dry etching. The diameter of etch stop recess 330 can be greater than the diameter of opening 334. After removing etch stop plug 332, inter-deck plug 328 can be exposed from upper channel hole 336.

Method 400 proceeds to operation 416, as illustrated in FIG. 4, in which a second memory film is formed along a sidewall of the first opening and in the recess of the channel hole. In some embodiments, an upper blocking layer, an upper storage layer, and an upper tunneling layer are subsequently deposited on the sidewall of the first opening and in the recess in this order. In some embodiments, the upper memory film fully fills in the recess.

Figure 3F:
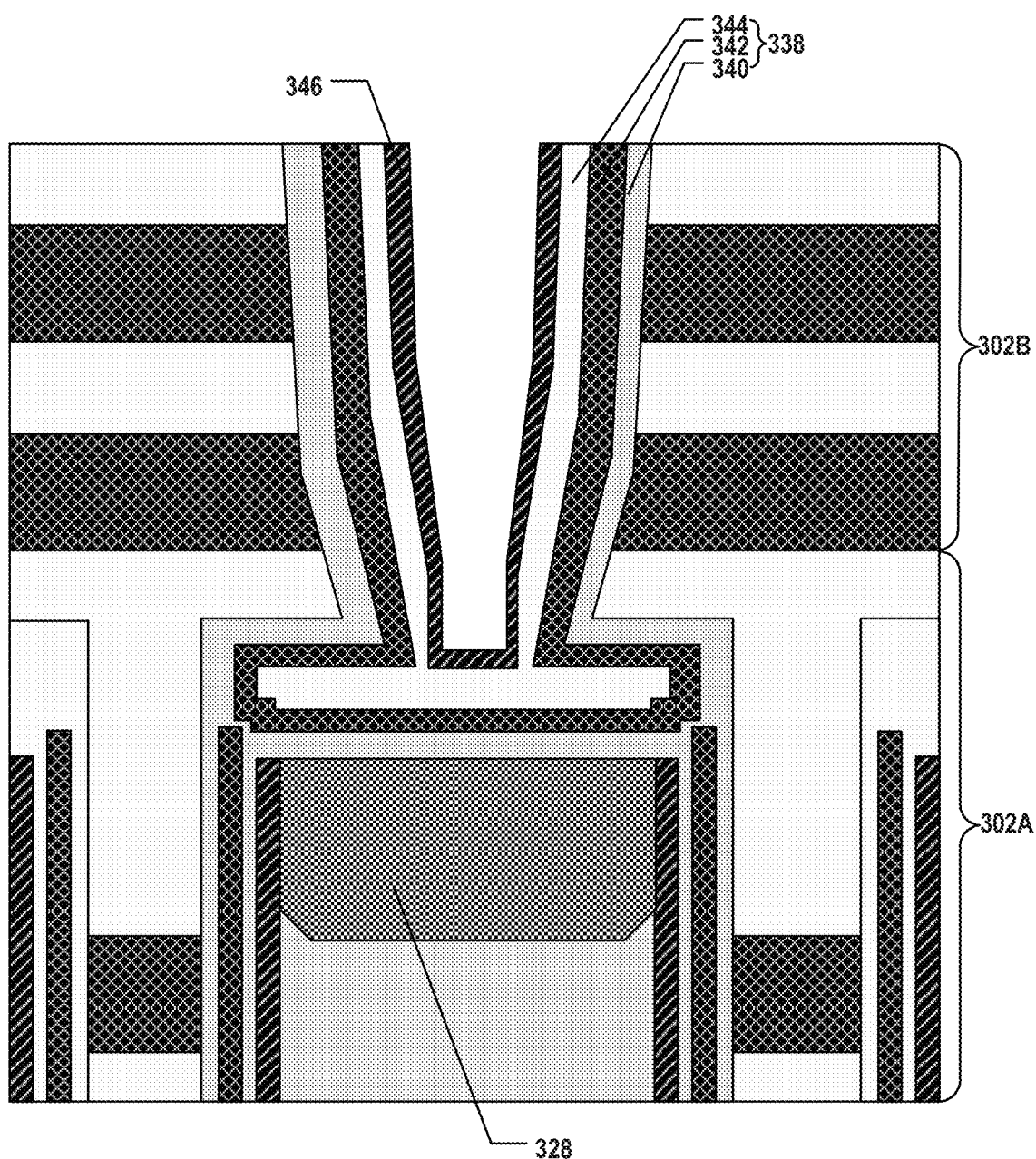

As illustrated in FIG. 3F, an upper memory film 338 (including an upper blocking layer 340, an upper storage layer 342, and an upper tunneling layer 344) and a channel sacrificial layer 346 are formed along the sidewall of upper channel hole 336 (shown in FIG. 3E). Upper memory film 338 can be also formed in etch stop recess 330 (shown in FIG. 3E). In some embodiments, upper memory film 338 fully fills in etch stop recess 330, leaving no space for another layer to be formed in etch stop recess 330. In some embodiments, upper memory film 338 is first deposited along the sidewall of upper channel hole 336 and in etch stop recess 330, and channel sacrificial layer 346 is then deposited over upper memory film 338. Upper blocking layer 340, upper storage layer 342, and upper tunneling layer 344 can be subsequently deposited in this order using one or more thin film deposition processes, such as ALD, CVD, PVD, any other suitable processes, or any combination thereof, to form upper memory film 338. To fill in etch stop recess 330, an ALD process can be used to deposit conformal thin layers of upper blocking layer 340, upper storage layer 342, and upper tunneling layer 344 as shown in FIG. 3F. The combined thickness of upper blocking layer 340, upper storage layer 342, and upper tunneling layer 344 can be controlled to be greater than one-half of the depth D of etch stop recess 330 (shown in FIG. 3B), such that the later deposited layers cannot extend laterally in etch stop recess 330. Channel sacrificial layer 346 can then be formed by depositing polysilicon or any other suitable sacrificial materials over upper tunneling layer 344 using one or more thin film deposition processes, such as ALD, CVD, PVD, any other suitable processes, or any combination thereof. In some embodiments, a silicon oxide layer, a silicon nitride layer, a silicon oxide layer, and a polysilicon layer (also known as a "SONO" structure) are subsequently deposited to form upper memory film 338 and channel sacrificial layer 346.

Method 400 proceeds to operation 418, as illustrated in FIG. 4, in which a second semiconductor channel is formed over the second memory film and extending vertically through part of the second memory film in the recess to contact the inter-deck plug. In some embodiments, a second opening is formed through the part of second memory film in the recess. The second opening can be etched through the part of upper blocking layer, upper storage layer, and upper tunneling layer in the etch stop recess to the inter-deck plug. The upper semiconductor channel can be deposited over the upper tunneling layer and extending vertically through the second opening to contact the inter-deck plug.

Figure 3G:
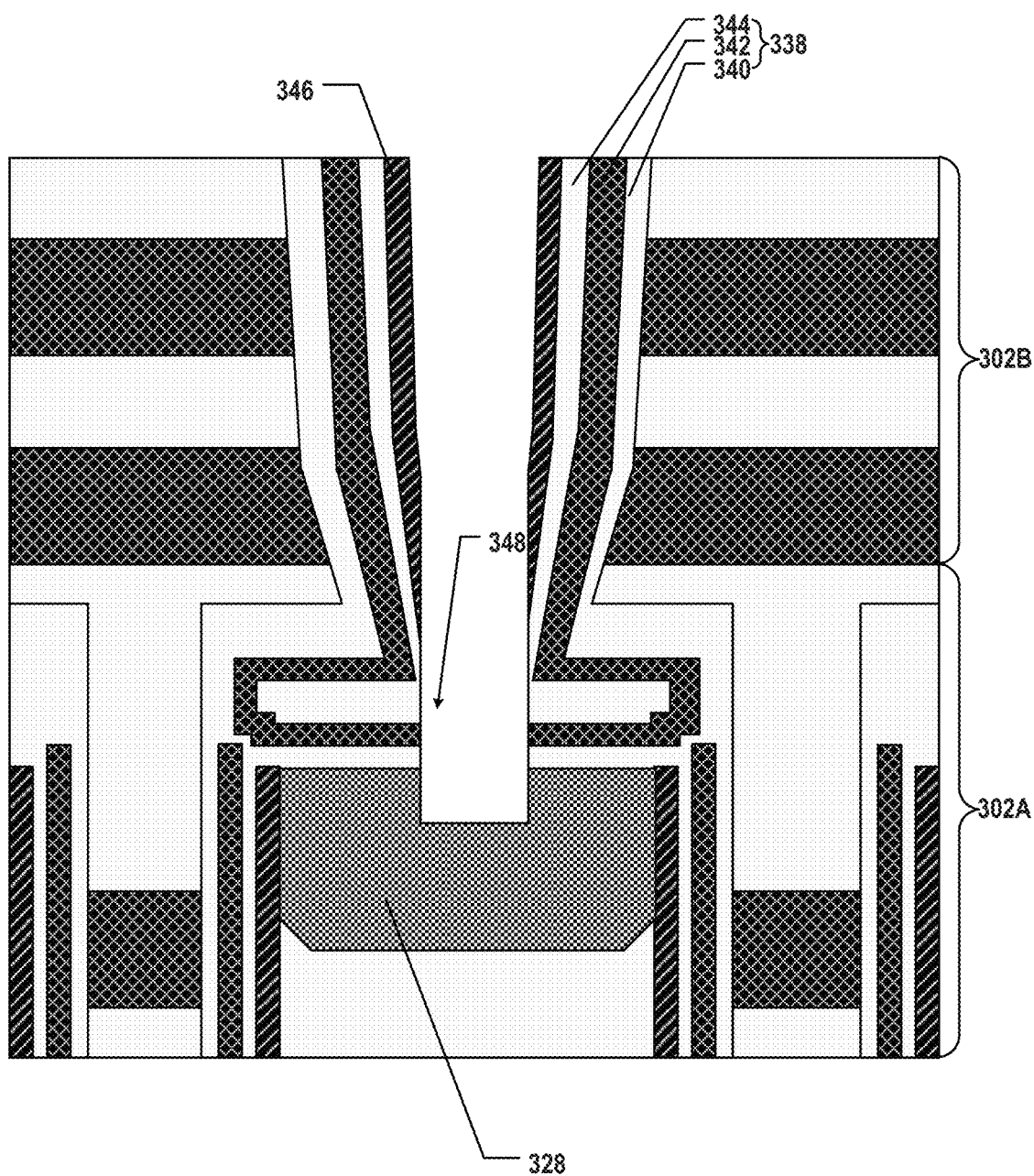

As illustrated in FIG. 3G, a contact opening 348 is formed through part of upper memory film 338 in etch stop recess 330 (shown in FIG. 3E) to inter-deck plug 328 using multiple wet etching and/or dry etching processes. In some embodiments, when a "SONO" structure of channel sacrificial layer 346 and upper memory film 338 is formed, a process known as "SONO punch" can be used to etch through channel sacrificial layer 346 and upper memory film 338 in etch stop recess 330 to reach inter-deck plug 328. In some embodiments, an additional etching process is used to extend contact opening 348 into part of inter-deck plug 328. As described above, by controlling the depth of etch stop recess 330 and the thickness of upper memory film 338, contact opening 348 can extend vertically without any lateral recesses.

Figure 3H:
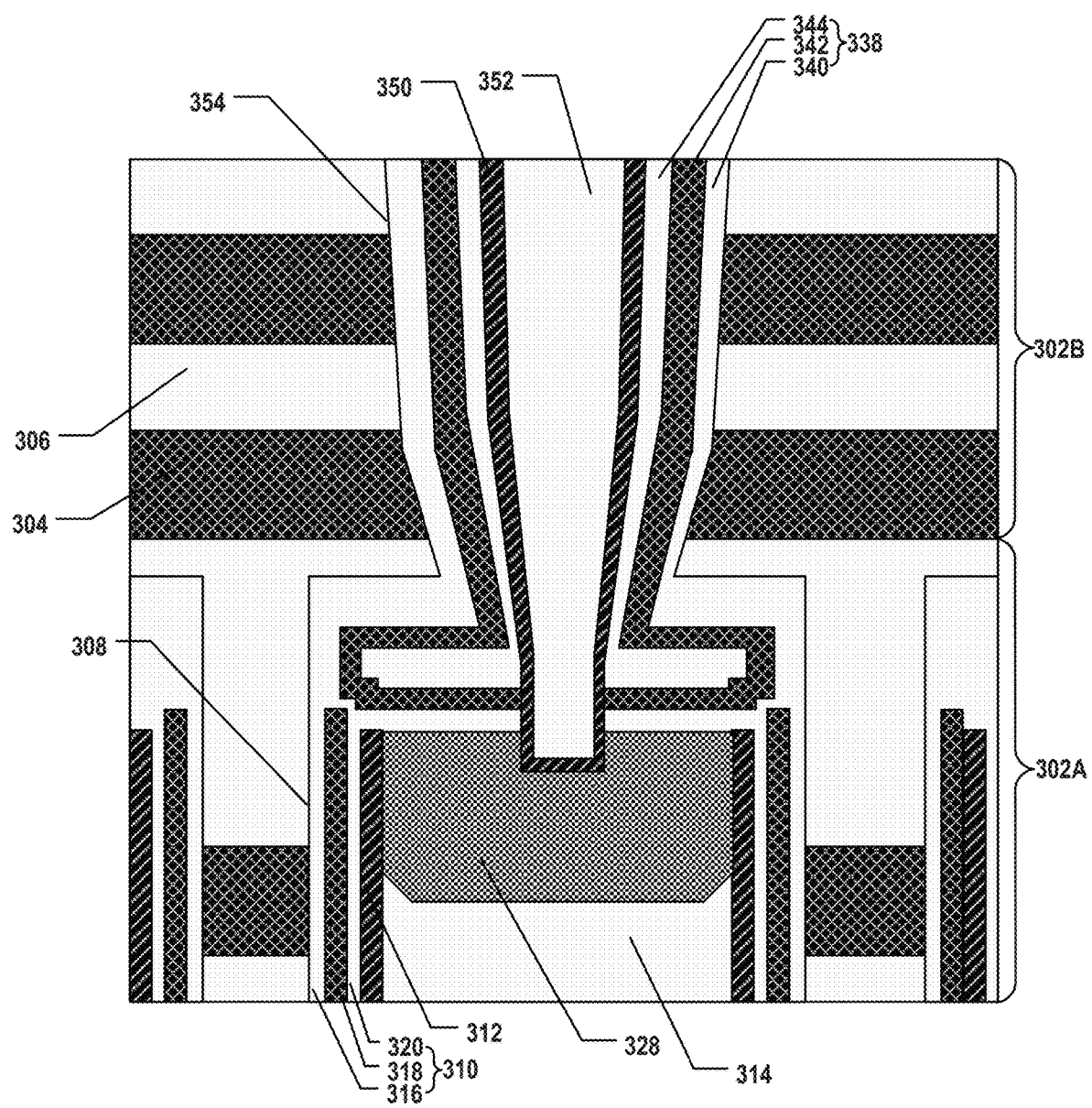

As illustrated in FIG. 3H, channel sacrificial layer 346 (shown in FIG. 3G) is removed by wet etching and/or dry etching, and upper semiconductor channel 350 is formed over upper tunneling layer 344 of upper memory film 338 and in contact opening 348 (shown in FIG. 3G) as well using one or more thin film deposition processes, such as CVD, PVD, ALD, electroplating, electroless plating, or any combination thereof, to contact inter-deck plug 328. In some embodiments, upper semiconductor channel 350 includes polysilicon. Upper semiconductor channel 350 can fully or partially fill contact opening 348 as long as it can contact inter-deck plug 328. For example, upper semiconductor channel 350 can be deposited on the sidewall of contact opening 348 without completely filling contact opening 348. As described above, by controlling the depth of etch stop recess 330 and the thickness of upper memory film 338, upper semiconductor channel 350 can extend vertically through part of upper memory film 338 in etch stop recess 330. As illustrated in FIG. 3H, an upper filling layer 352, such as a silicon oxide layer, is formed in upper channel hole 336 (shown in FIG. 3E) to fully or partially fill the remaining space of upper channel hole 336 using one or more thin film deposition processes, such as CVD, PVD, ALD, electroplating, electroless plating, or any combination thereof. An upper channel structure 354 is thus formed as shown in FIG. 3H.

Although not illustrated, it is understood that after the formation of lower and upper channel structures 308 and 354 as shown in FIGS. 3A-3H, a dual-deck memory stack can be formed by replacing sacrificial layers 304 in lower and upper dielectric decks 302A and 302B with conductor layers. The memory stack thus can include a plurality of conductor/dielectric layer pairs. In some embodiments, to form the memory stack, a slit opening (e.g., a gate line slit) can be formed through lower and upper dielectric decks 302A and 302B, sacrificial layers 304 in lower and upper dielectric decks 302A and 302B can be etched by applying the etchants through the slit opening to form a plurality of lateral recesses, and the conductor layers can be deposited in the lateral recesses.

According to one aspect of the present disclosure, a 3D memory device includes a substrate, a first memory deck including a first plurality of interleaved conductor layers and dielectric layers above the substrate, a first channel structure extending vertically through the first memory deck, a second memory deck including a second plurality of interleaved conductor layers and dielectric layers above the first memory deck, and a second channel structure extending vertically through the second memory deck. The first channel structure includes a first memory film and a first semiconductor channel along a sidewall of the first channel structure, and an inter-deck plug in an upper portion of the first channel structure and in contact with the first semiconductor channel A lateral surface of the inter-deck plug is smooth. The second channel structure includes a second memory film and a second semiconductor channel along a sidewall of the second channel structure. The second semiconductor channel is in contact with the inter-deck plug.

In some embodiments, a top surface of the inter-deck plug is flush with an upper end of the first semiconductor channel. The top surface of the inter-deck plug is below an upper end of the first memory film, according to some embodiments. In some embodiments, an upper end of the first memory film is not in contact with the inter-deck plug.

In some embodiments, the second channel structure includes a lower portion in which part of the second memory film extends laterally. In some embodiments, a thickness of the lower portion of the second channel structure is not greater than two times of a thickness of the second memory film. The thickness of the lower portion of the second channel structure can be between about 20 nm and about 40 nm.

In some embodiments, the second semiconductor channel extends vertically through the lower portion of the second channel structure to contact the inter-deck plug.

In some embodiments, each of the first semiconductor channel, the second semiconductor channel, and the inter-deck plug includes polysilicon.

In some embodiments, each of the first memory film and the second memory film comprises a tunneling layer, a storage layer, and a blocking layer disposed radially from a center of the respective first or second channel structure in this order.

According to another aspect of the present disclosure, a method for forming a 3D memory device is disclosed. A first dielectric deck including a first plurality of interleaved sacrificial layers and dielectric layers is formed above a substrate. A first channel structure extending vertically through the first dielectric deck and including a first memory film and a first semiconductor channel is formed. An inter-deck plug is formed in an upper portion of the first channel structure and in contact with the first semiconductor channel, and a recess is formed between a top surface of the inter-deck plug and a top surface of the first dielectric deck. An etch stop plug is formed in the recess to cover the top surface of the inter-deck plug. A second dielectric deck including a second plurality of interleaved sacrificial layers and dielectric layers is formed above the first dielectric deck. A first opening extending vertically through the second dielectric deck and ending at the etch stop plug is formed. The etch stop plug is removed from the recess to form a channel hole including the first opening and the recess. A second memory film is formed along a sidewall of the first opening and in the recess of the channel hole. A second semiconductor channel is formed over the second memory film and extending vertically through part of the second memory film in the recess to contact the inter-deck plug.

In some embodiments, to form the inter-deck plug and the recess, upper portions of the first memory film and the first semiconductor channel are removed, an initial inter-deck plug having a top surface flush with the top surface of the first dielectric deck and a bottom surface below an upper end of the first semiconductor channel is formed, and part of the initial inter-deck plug above the upper end of the first semiconductor channel is removed to form the inter-deck plug and the recess.

In some embodiments, a depth of the recess is not greater than two times of a thickness of the second memory film. The depth of the recess can be between about 20 nm and about 40 nm.

In some embodiments, the part of the initial inter-deck plug is removed such that a top surface of the inter-deck plug is flush with an upper end of the first semiconductor channel.

In some embodiments, a lateral surface of the inter-deck plug is smooth.

In some embodiments, to form the second memory film, a blocking layer, a storage layer, and a tunneling layer are subsequently formed along the sidewall of the first opening and in the recess in this order.

In some embodiments, the second memory film fully fills in the recess.

In some embodiments, to form the second semiconductor channel, a second opening is formed through the part of second memory film in the recess.

In some embodiments, each of the first semiconductor channel, the second semiconductor channel, and the inter-deck plug includes polysilicon.

In some embodiments, a diameter of the recess is greater than a diameter of the first opening.

According to still another aspect of the present disclosure, a method for forming an inter-deck plug in a 3D memory device is disclosed. A lower channel structure extending vertically through a first plurality of interleaved sacrificial layers and dielectric layers above a substrate is formed. A stepped recess is etched in an upper portion of the lower channel structure. A semiconductor layer is deposited to fill the stepped recess. An etch stop recess is etched in an upper portion of the semiconductor layer to form an inter-deck plug having a smooth lateral surface. An etch stop layer is deposited to fill the etch stop recess. A second plurality of interleaved sacrificial layers and dielectric layers are alternatingly deposited above the etch stop layer and the first plurality of interleaved sacrificial layers and dielectric layers. A first opening is etched through the second plurality of interleaved sacrificial layers and dielectric layers until being stopped by the etch stop layer. The etch stop layer is etched away from the etch stop recess to expose the inter-deck plug.

In some embodiments, an upper blocking layer, an upper storage layer, and an upper tunneling layer are subsequently deposited along a sidewall of the first opening and in the etch stop recess in this order, a second opening is etched through the part of upper blocking layer, upper storage layer, and upper tunneling layer in the etch stop recess to the inter-deck plug, and an upper semiconductor channel is deposited over the upper tunneling layer and extending vertically through the second opening to contact the inter-deck plug.

In some embodiments, to form the lower channel structure, a lower memory film, a lower semiconductor channel, and a lower filling layer are subsequently deposited in this order. In some embodiments, to etch the stepped recess, (i) the lower filling layer and (ii) the lower semiconductor channel and lower memory film are etched to different depths.

In some embodiments, the etch stop layer includes a metal.

In some embodiments, a thickness of the etch stop layer is not greater than two times of a combined thickness of the upper blocking layer, upper storage layer, and upper tunneling layer. The thickness of the etch stop layer can be between about 20 nm and about 40 nm.

In some embodiments, to etch the etch stop recess, the lower semiconductor channel is etched such that an upper end of the lower semiconductor channel is flush with a top surface of the inter-deck plug.

In some embodiments, the upper blocking layer, upper storage layer, and upper tunneling layer fully fill in the etch stop recess.

In some embodiments, a diameter of the etch stop recess is greater than a diameter of the first opening.

The foregoing description of the specific embodiments will so reveal the general nature of the present disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections may set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. A method for forming a three-dimensional (3D) memory device, comprising: forming a first dielectric deck comprising a first plurality of interleaved sacrificial layers and dielectric layers above a substrate; forming a first channel structure extending vertically through the first dielectric deck and comprising a first memory film and a first semiconductor channel; forming (i) an inter-deck plug in an upper portion of the first channel structure and in contact with the first semiconductor channel and (ii) a recess with a stepped portion between a top surface of the inter-deck plug and a top surface of the first dielectric deck; forming an etch stop plug in the recess to cover the top surface of the inter-deck plug; forming a second dielectric deck comprising a second plurality of interleaved sacrificial layers and dielectric layers above the first dielectric deck; forming a first opening extending vertically through the second dielectric deck and ending at the etch stop plug; removing the etch stop plug from the recess to form a channel hole comprising the first opening and the recess; forming a second memory film along a sidewall of the first opening and in the recess of the channel hole; and forming a second semiconductor channel over the second memory film and extending vertically through part of the second memory film in the recess to contact the inter-deck plug.

2. The method of claim 1, wherein forming the inter-deck plug and the recess comprises:
removing upper portions of the first memory film and the first semiconductor channel;
forming an initial inter-deck plug having a top surface flush with the top surface of the first dielectric deck and a bottom surface below an upper end of the first semiconductor channel; and
removing part of the initial inter-deck plug above the upper end of the first semiconductor channel to form the inter-deck plug and the recess.

3. The method of claim 1, where a depth of the recess is not greater than two times of a thickness of the second memory film.

4. The method of claim 3, wherein the depth of the recess is between about 20 nm and about 40 nm.

5. The method of claim 2, wherein the part of the initial inter-deck plug is removed such that a top surface of the inter-deck plug is flush with an upper end of the first semiconductor channel.

6. The method of claim 1, wherein a lateral surface of the inter-deck plug is smooth.

7. The method of claim 1, wherein forming the second memory film comprises subsequently forming a blocking layer, a storage layer, and a tunneling layer along the sidewall of the first opening and in the recess in this order.

8. The method of claim 1, wherein the second memory film fully fills in the recess.

9. The method of claim 1, wherein forming the second semiconductor channel comprises forming a second opening through the part of second memory film in the recess.

10. The method of claim 1, wherein each of the first semiconductor channel, the second semiconductor channel, and the inter-deck plug comprises polysilicon.

11. The method of claim 1, wherein a diameter of the recess is greater than a diameter of the first opening.

12. A method for forming an inter-deck plug in a three-dimensional (3D) memory device, comprising:
forming a lower channel structure extending vertically through a first plurality of interleaved sacrificial layers and dielectric layers above a substrate;
etching a stepped recess in an upper portion of the lower channel structure;
depositing a semiconductor layer to fill the stepped recess;
etching an etch stop recess in an upper portion of the semiconductor layer to form an inter-deck plug having a smooth lateral surface;
depositing an etch stop layer to fill the etch stop recess;

alternatingly depositing a second plurality of interleaved sacrificial layers and dielectric layers above the etch stop layer and the first plurality of interleaved sacrificial layers and dielectric layers;

etching a first opening through the second plurality of interleaved sacrificial layers and dielectric layers until being stopped by the etch stop layer; and etching away the etch stop layer from the etch stop recess to expose the inter-deck plug.

13. The method of claim 12, further comprising:

subsequently depositing an upper blocking layer, an upper storage layer, and an upper tunneling layer along a sidewall of the first opening and in the etch stop recess in this order;

etching a second opening through the part of upper blocking layer, upper storage layer, and upper tunneling layer in the etch stop recess to the inter-deck plug; and depositing an upper semiconductor channel over the upper tunneling layer and extending vertically through the second opening to contact the inter-deck plug.

14. The method of claim 12, wherein:

forming the lower channel structure comprises subsequently depositing a lower memory film, a lower semiconductor channel, and a lower filling layer in this order; and etching the stepped recess comprises etching (i) the lower filling layer and (ii) the lower semiconductor channel and lower memory film to different depths.

15. The method of claim 12, wherein the etch stop layer comprises a metal.

16. The method of claim 13, wherein a thickness of the etch stop layer is not greater than two times of a combined thickness of the upper blocking layer, upper storage layer, and upper tunneling layer.

17. The method of claim 16, wherein the thickness of the etch stop layer is between about 20 nm and about 40 nm.

18. The method of claim 12, wherein etching the etch stop recess comprises etching the lower semiconductor channel such that an upper end of the lower semiconductor channel is flush with a top surface of the inter-deck plug.

19. The method of claim 13, wherein the upper blocking layer, upper storage layer, and upper tunneling layer fully fill in the etch stop recess.

20. The method of claim 12, wherein a diameter of the etch stop recess is greater than a diameter of the first opening.

* * * * *